United States Patent [19]
Kobayashi

[11] Patent Number: 4,757,214
[45] Date of Patent: Jul. 12, 1988

[54] PULSE GENERATOR CIRCUIT

[75] Inventor: Yasuo Kobayashi, Tokyo, Japan

[73] Assignee: NEC Corporation, Tokyo, Japan

[21] Appl. No.: 830,799

[22] Filed: Feb. 19, 1986

[30] Foreign Application Priority Data

Feb. 19, 1985 [JP] Japan .................................. 60-30742

[51] Int. Cl.[4] ...................... H03K 3/017; H03K 19/20; H03K 5/13

[52] U.S. Cl. .................................... 307/265; 307/445; 307/480; 307/601; 307/448

[58] Field of Search ............... 307/440, 445, 528, 265, 307/266, 480, 443, 448, 465, 601; 328/58, 110, 111

[56] References Cited

U.S. PATENT DOCUMENTS 3,850,512 6/1975 Kumakawa et al. ................ 307/445
3,862,440 1/1975 Suzuki et al. ....................... 307/266

*Primary Examiner*—Stanley D. Miller
*Assistant Examiner*—B. P. Davis
*Attorney, Agent, or Firm*—Sughrue, Mion, Zinn, Macpeak and Seas

[57] ABSTRACT

A pulse generator circuit includes (a) a delay circuit responsive to an input signal for producing an output signal after a predetermined delay time, (b) a first logic circuit responsive to the input signal and this output signal for producing an output signal having a first logic state when both of the input signal and the output signal from the delay circuit are concurrently of a second logic value, (c) a second logic circuit responsive to the input signal and the output signal from the delay circuit for producing an output signal having the first logic state when both the input signal and the output signal from the delay circuit are of the first logic value, and (d) a third logic circuit responsive to the output signal from the first logic circuit and to the output signal from the second logic circuit for producing an output signal having a first logic state when both of the output signal from the first logic circuit and the output signal from the second logic circuit are concurrently of the second logic value.

8 Claims, 6 Drawing Sheets

PULSE GENERATOR CIRCUIT

FIELD OF THE INVENTION

The present invention relates to a pulse generator circuit and, more particularly, to a logic circuit adapted to generate pulses of a predetermined time duration in response the leading edges of supplied input pulses.

DESCRIPTION OF THE PRIOR ART

Various semiconductor integrated circuits such as semiconductor memories use pulse generator circuits to generate pulses of a predetermined time duration in response to the leading edges of supplied input pulses. The general arrangement of a known example of such pulse generator circuits is shown in FIG. 1 of the accompanying drawings.

As shown in FIG. 1 of the drawings, the prior-art pulse generator circuit, generally represented by 10, has an input terminal 12 (IN) and includes a logic inverter circuit 14, first and second delay circuits 16 and 18, and first to third two-input NOR gate circuits 20 to 24. The inverter circuit 14 has an input terminal connected to the input terminal 12 of the generator circuit 10. The first delay circuit 16 has an input terminal connected to the input terminal 12 of the pulse generator cuircuit 10 and an output terminal connected to one input terminal of the first NOR gate circuit 20, the other input terminal of which is connected directly to the input terminal 12 of the circuit 10. The second delay circuit 18 has an input terminal connected to the output terminal of the inverter circuit 14 and an output terminal connected to one input terminal of the second NOR gate circuit 20, the other input terminal of which is connected directly to the output terminal of the inverter circuit 14. The first and second NOR gate circuits 20 and 22 have their respective output terminals connected to the input terminals of the third NOR gate circuit 24.

FIG. 2 of the drawings depicts a C-MOS implementation of the prior-art pulse generator circuit 10 thus constructed. As shown, the inverter circuit 14 is composed of p-channel and n-channel C-MOS transistors 26 and 28 which have a common gate electrode connected to the input terminal 12 of the pulse generator circuit 10. The p-channel transistor 26 has its source connected to a supply voltage $V_{DD}$ and the n-channel transistor 28 has its source connected to the ground line. The common drain of the transistors 26 and 28 forms an output terminal $Q_{14}$ of the inverter circuit 14. On the other hand, the first and second delay circuits 16 and 18 are similar in construction and, thus, the respective component elements thereof are indicated by like reference numerals. Each of these delay circuits 16 and 18 is composed of two C-MOS inverters connected in cascade form across a capacitor 30 provided therebetween. In each of the delay circuits 16 and 18, the first-stage C-MOS inverter consists of p-channel and n-channel transistors 32 and 34 having a common gate electrode and a common drain and the second-stage C-MOS inverter consists of p-channel and n-channel transistors 36 and 38 also having a common gate electrode and a common drain electrode. The common drain electrode of the transistors 32 and 34 is connected to the common gate electrode of the transistors 36 and 38. Each of the p-channel transistors 32 and 36 has its source connected to the supply voltage $V_{DD}$ and each of the n-channel transistors 34 and 38 has its source connected to the ground line. The capacitor 30 in each of the delay circuits 16 and 18 has one of its electrodes connected to a node between a common drain electrode of the transistors 32 and 34 and the common gate electrode of the transistors 36 and 38, the other electrode of the capacitor 30 being connected to the ground line. The common gate electrode of the transistors 32 and 34 forming the first-stage C-MOS inverter of the first delay circuit 16 is connected to the input terminal 12 of the pulse generator circuit 10. The common drain electrode of the transistors 36 and 38 forming the second-stage C-MOS inverter of the delay circuit 16 form an output terminal $Q_{16}$ of the delay circuit 16. On the other hand, the common gate electrode of the transistors 32 and 34 forming the first-stage C-MOS inverter of the second delay circuit 18 is connected to the output terminals $Q_{14}$ of the inverter circuit 14, viz., to the common drain electrode of the transistors 26 and 28 forming the inverter circuit 14. The common drain electrode of the transistors 36 and 38 forming the second-stage C-MOS inverter of the delay circuit 18 form an output terminal $Q_{18}$ of the delay circuit 16.

The first, second and third NOR gate circuits 20, 22 and 24 are all similar in construction and, thus the respective component elements thereof are also indicated by like reference numerals. Each of the NOR gate circuits 20, 22 and 24 is composed of a combination of p-channel and n-channel transistors 40 and 42 having a common gate electrode and p-channel and n-channel transistors 44 and 46 having a common gate electrode and a common drain electrode. In each of the NOR gate circuits 20, 22 and 24, the p-channel transistor 40 has its source connected to the supply voltage $V_{DD}$ and its drain connected to the source of the n-channel transistor 44, while the n-channel transistor 42 has its drain connected to the common drain electrode of the paired p-channel and n-channel transistors 44 and 46 and its source connected to the ground line. The source of the transistor 46 is also connected to ground. The common gate electrode of the transistors 40 and 42 in the first NOR gate circuit 20 is connected to the input terminal 12 of the pulse generator circuit 10. The common gate electrode of the transistors 44 and 46 in the first NOR gate circuit 20 is connected to the output terminal $Q_{16}$ of the first delay circuit 16, viz., to the common drain electrode of the p-channel and n-channel transistors 36 and 38 of the delay circuit 16. The node between the drains of the transistors 42, 44 and 46 of the first NOR gate circuit 20 forms an output terminal $Q_{20}$ of the NOR gate circuit 20. On the other hand, the common gate electrode of the transistors 40 and 42 in the second NOR gate circuit 22 is connected to the output terminal $Q_{14}$ of the inverter circuit 14, viz., to the common drain electrode of the p-channel and n-channel transistors 26 and 28 forming the inverter circuit 14. The common gate electrode of the transistors 44 and 46 in the second NOR gate circuit 22 is connected to the output terminal $Q_{18}$ of the second delay circuit 18, viz., to the common drain electrode of the p-channel and n-channel transistors 36 and 38 of the delay circuit 18. The node between the drains of the transistors 42, 44 and 46 of the second NOR gate circuit 22 forms an output terminal $Q_{22}$ of the NOR gate circuit 22. Furthermore, the common gate electrode of the transistors 40 and 42 in the third NOR gate circuit 24 is connected to the output terminal $Q_{20}$ of the first NOR gate circuit 20, viz., to the drains of the p-channel and n-channel transistors 44 and 46 and the n-channel transistor 42 in the NOR gate circuit 20. The common gate electrode of the transistors 44 and 46 in the third NOR gate circuit 24 is connected to the output terminal $Q_{22}$ of the second NOR gate circuit 22, viz., to the drains of the p-channel and n-channel transistors 44 and 46 and the n-channel transistor 42 in the NOR gate circuit 22. The node between the drains of the transistors 42, 44 and 46 of the third NOR gate circuit 24 forms an output terminal OUT of the pulse generator circuit 10 herein shown.

FIGS. 3A and 3B of the drawings show waveforms of the various signals appearing in the pulse generator circuit 10 thus constructed and arranged. In each of FIGS. 3A and 3B, these waveforms include a waveform "IN" which appears at the input terminal 12 of the pulse generator circuit 10, waveforms which appear at the output terminals $Q_{14}$, $Q_{16}$, $Q_{18}$, $Q_{20}$ and $Q_{22}$ of the inverter circuit 14, first and second delay circuits 16 and 18 and first and second NOR gate circuits 20 and 22, respectively, and a waveform which appears at the output terminal OUT of the pulse generator circuit 10. The time duration as represented by T of the logic "1" pulse of the waveform "OUT" appearing at the output terminal of the third NOR gate circuit 24 is approximately equal to the delay time achieved by each of the delay circuits 16 and 18 and can therefore be adjusted by varying the time constant of the capacitor 30 included in each delay circuit.

BACKGROUND OF THE INVENTION

In the meantime, semiconductor memories have recently been commercialized which include pulse generators adapted to produce internal circuit control signals through detection of the transitions, viz., the rise and fall of address input signals, for achieving reduction in the power dissipation of the memory devices. A memory device of this nature necessitates the provision of as many pulse generators as there are address input lines used for the memory device. For example, a memory device having the storage capacity of 64 kilowords must use sixteen pulse generators for the 16 bits per address. If each of such pulse generators is implemented using the C-MOS circuit hereinbefore described with reference to FIG. 2, a total of 384 circuit components must be used in view of the twenty two transistors and two capacitors which form each of the pulse generators. Where the pulse generators are implemented as on-chip circuits in the memory device, they will occupy a disproportionately large space on the chip and will thus make it extremely difficult to realize a mass memory with a desired storage capacity. This is a problem encountered in not only semiconductor memories but also in other types of semiconductor integrated circuits which use pulse generators responsive to the transitions of input signals.

Another problem in prior-art pulse generator circuits of the nature described with reference to FIGS. 1 and 2 is the requirement for the provision of two similar delay circuits 16 and 18 each including the capacitor 30 for the adjustment of the pulsewidth T (FIGS. 3A and 3B) of the pulses to be produced by the pulse generator circuit. This is objectionable not only from the view point of circuit configuration but because of the fact that the two capacitors 30 provided in the pulse generator circuit must be calibrated to have precisely equal time constants to provide a fixed pulsewidth T. Difficulties are however encountered in correctly calibrating the time constants of the two capacitors 30 and accordingly in providing a fixed pulsewidth.

It is therefore an important object of the present invention to provide an improved pulse generator circuit which is composed of a reduced number of circuit components and which will thus permit the use of a desired number of such circuits on a semiconductor device such as, typically, a semiconductor memory device.

It is another important object of the present invention to provide an improved pulse generator circuit which is capable of generating pulses with a correctly fixed pulsewidth.

SUMMARY OF THE INVENTION

In accordance with the present invention, there is provided a pulse generator circuit comprising (a) a delay circuit responsive to an input signal for producing an output signal with a predetermined delay time, (b) a first logic circuit responsive to the input signal and this output signal for producing an output signal with a first logic state when both of the input signal and the output signal from the delay circuit are concurrently of a second logic value, (c) a second logic circuit responsive to the input signal and the output signal from the delay circuit for producing an output signal with the first logic state when both the input signal and the output signal from the delay circuit are of the first logic value, and (d) a third logic circuit responsive to the output signal from the first logic circuit and to the output signal from the second logic circuit for producing an output signal with a first logic state when both the output signal from the first logic circuit and the output signal from the second logic circuit are concurrently of the second logic value. In one preferred embodiment of the present invention, each of the first and third logic circuits consists of a logic NOR gate circuit and the second logic circuit consists of a logic AND gate circuit. In another preferred embodiment of the present invention, each of the first and third logic circuits consists of a logic NAND gate circuit and the second logic circuit consists of a logic OR gate circuit.

BRIEF DESCRIPTION OF THE DRAWINGS

The features and advantages of a pulse generator circuit according to the present invention will be more clearly appreciated from the following description taken in conjunction with the accompanying drawings in which like reference numerals designate similar or corresponding units and elements and in which.

DESCRIPTION OF THE PREFERRED EMBODIMENTS

First Preferred Embodiment

Figure 4:
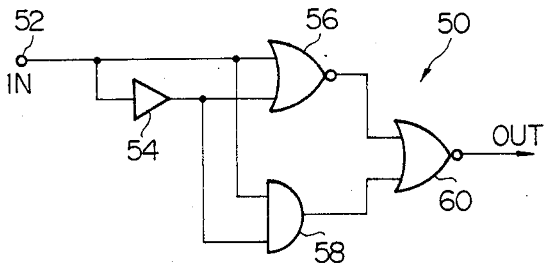
FIG. 4 is a schematic diagram showing a first preferred embodiment of a pulse generator circuit according to the present invention.

Referring to FIG. 4 of the drawings, a pulse generator circuit embodying the present invention, generally represented by 50, has an input terminal 52 and includes a delay circuit 54, a first two-input NOR gate circuit 56, an AND gate circuit 58 and a second two-input NOR gate circuit 60. The delay circuit 54 has an input terminal connected to the input terminal 52 of the pulse generator circuit 50 and an output terminal connected to one input terminal of the first NOR gate circuit 56 and one input terminal of the AND gate circuit 58, the other input terminal of each of the NOR gate circuit 56 and AND gate circuit 58 being connected directly to the input terminal 52 of the circuit 50. The NOR gate circuit 56 and AND gate circuit 58 have their respective output terminals connected to the input terminals of the second NOR gate circuit 60.

Figure 5:
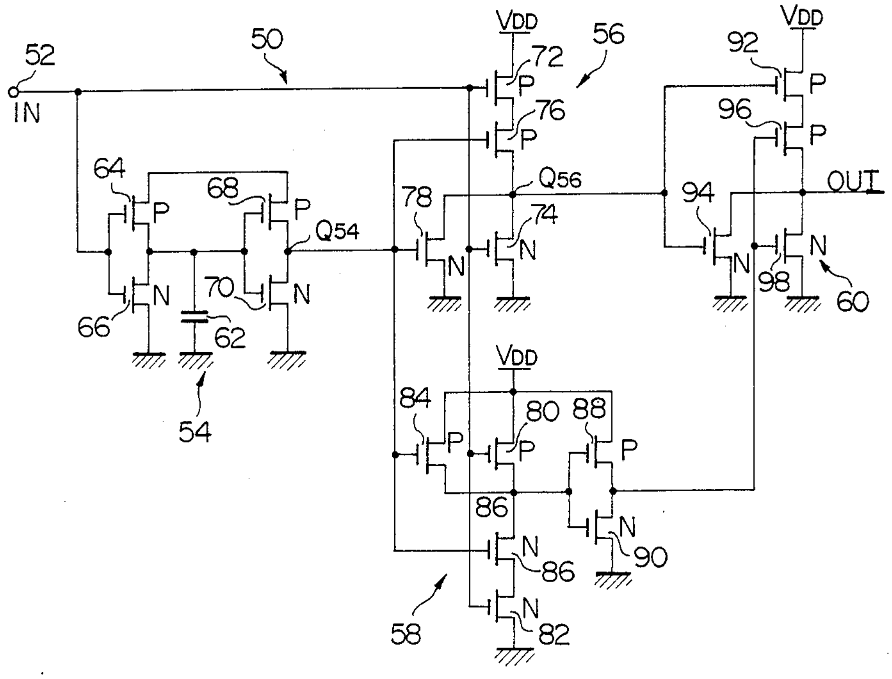
FIG. 5 is a circuit diagram showing a C-MOS implementation of the circuit illustrated in FIG. 4.

FIG. 5 of the drawings depicts a C-MOS implementation of the prior-art pulse generator circuit 50 thus constructed. As shown, the delay circuit 54 is composed of two C-MOS inverters connected in cascade form across a capacitor 62 provided therebetween. The first-stage C-MOS inverter of the delay circuit 54 comprises p-channel and n-channel transistors 64 and 66 having a common gate electrode and a common drain and the second-stage C-MOS inverter of the delay circuit 54 comprises p-channel and n-channel transistors 68 and 70 also having a common gate electrode and a common drain electrode. The common drain electrode of the transistors 64 and 66 is connected to the common gate electrode of the transistors 68 and 70 through a node connected to the capacitor 62. Each of the p-channel transistors 64 and 68 has its source connected to a supply voltage $V_{DD}$ and each of the n-channel transistors 66 and 70 has its source connected to the ground line. The capacitor 62 has one of its electrodes connected to the node between the common drain electrode of the transistors 64 and 66 and the common gate electrode of the transistors 68 and 70, the other electrode of the capacitor 62 being connected to ground. The common gate electrode of the transistors 64 and 66 forming the first-stage C-MOS inverter of the delay circuit 54 is connected to the input terminal 52 of the pulse generator circuit 50. The common drain electrode of the transistors 68 and 70 forming the second stage inverter of the delay circuit 54 forms an output terminal $Q_{54}$ of the delay circuit 54.

On the other hand, the first NOR gate circuit 56 comprises a combination of p-channel and n-channel transistors 72 and 74 having a common gate electrode and a combination of p-channel and n-channel transistors 76 and 78 having a common gate electrode and a common drain electrode. The common gate electrode of the transistors 72 and 74 is connected to the input terminal 52 of the pulse generator circuit 50, while the common gate electrode of the transistors 76 and 78 is connected to the output terminal $Q_{54}$ of the delay circuit 54, viz., to the common drain electrode of the p-channel and n-channel transistors 68 and 70 of the delay circuit 54. The p-channel transistor 72 has its source connected to the supply voltage $V_{DD}$ and its drain connected to the source of the p-channel transistor 76, while the n-channel transistor 74 has its drain connected to the common drain electrode of the paired p-channel and n-channel transistors 76 and 78 and to the drain of the p-channel transistor 76 and its source connected to ground. The source of the transistor 78 is also connected to ground. The node between the drains of the transistors 74, 76 and 78 forms an output terminal $Q_{56}$ of the first NOR gate circuit 56.

Furthermore, the AND gate circuit 58 comprises a combination of p-channel and n-channel transistors 80 and 82 having a common gate electrode, a combination of p-channel and n-channel transistors 84 and 86 having a common gate electrode and a common drain electrode, and a combination of p-channel and n-channel transistors 88 and 90 also having a common gate electrode and a common drain electrode. The common gate electrode of the transistors 80 and 82 is connected to the input terminal 52 of the pulse generator circuit 50, while the common gate electrode of the transistors 84 and 86 is connected to the output terminal $Q_{54}$ of the delay circuit 54, viz., to the common drain electrode of the p-channel and n-channel transistors 68 and 70 of the delay circuit 54. Each of the p-channel transistors 80 and 84 has its source connected to the supply voltage $V_{DD}$ and its drain connected to the source of the n-channel transistor 86, the p-channel transistor 88 also having its source conected to the supply voltage $V_{DD}$. The n-channel transistor 86 has its source connected to the drain of the n-channel transistor 82 which has its source connected to ground. The common gate electrode of the transistors 88 and 90 is connected to the node between the drains of the transistors 80, 84 and 86. The source of the n-channel transistor 90 is also connected to ground line. The common drain electrode of the p-channel and n-channel transistors 88 and 90 forms an output terminal $Q_{58}$ of the AND gate circuit 58.

The second NOR gate circuit 60 is essentially similar in construction to the first NOR gate circuit 56 and thus comprises a combination of p-channel and n-channel transistors 92 and 94 having a common gate electrode and a combination of p-channel and n-channel transistors 96 and 98 having a common gate electrode and a common drain electrode. The common gate electrode of the transistors 92 and 94 is connected to the output terminal $Q_{56}$ of the first NOR gate circuit 56, viz., to the node between the drains of the transistors 74, 76 and 78 of the NOR gate circuit 56, while the common gate electrode of the transistors 96 and 98 is connected to the output terminal $Q_{58}$ of the AND gate circuit 58, viz., to the common drain electrode of the p-channel and n-channel transistors 88 and 90 of the AND gate circuit 58. The p-channel transistor 92 has its source connected to the supply voltage $V_{DD}$ and its drain connected to the source of the p-channel transistor 96. The n-channel transistors 94 has its drain connected to the common drain electrode of the paired p-channel and n-channel transistors 96 and 98 and its source connected to ground. The source of the transistor 98 is also connected to ground. The node between the drains of the transistors 94, 96 and 98 forms an output terminal OUT of the pulse generator circuit 50.

Figure 6A:
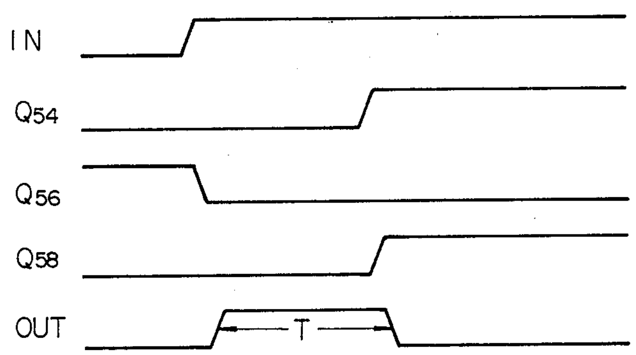
FIGS. 6A and 6B are timing charts which show waveforms of various signals appearing in the pulse generator circuit shown in FIGS. 4 and 5.
Figure 6B:
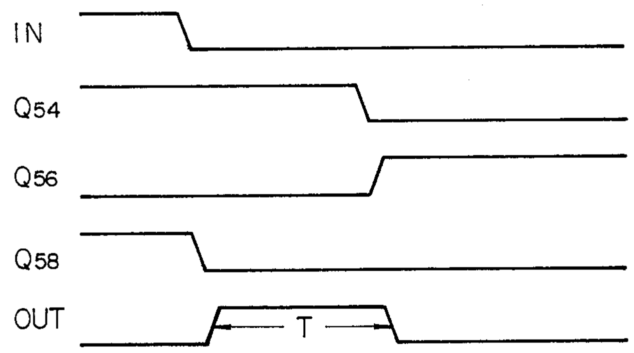

FIGS. 6A and 6B of the drawings show waveforms of the various signals appearing in the pulse generator circuit 50 thus constructed and arranged. In each of FIGS. 6A and 6B, these waveforms include a waveform "IN" which appears at the input terminal 52 of the pulse generator circuit 50, waveforms which appear at the output terminals $Q_{54}$, $Q_{56}$ and $Q_{58}$ of the delay circuit 54, first NOR gate circuit 56 and AND gate circuit 58, respectively, and a waveform "OUT" which appears at the output terminal of the pulse generator circuit 50.

In operation, there remains a signal with low level at the output terminal $Q_{54}$ of the delay circuit 54 for a certain period of time after the signal at the input terminal 52 of the pulse generator circuit 50 is shifted from low level to high level. With the signal of high level being present at the input terminal 52, the NOR gate circuit 56 is maintained in a state producing a logic "0" signal at the output terminal $Q_{56}$ thereof as will be seen from the waveform $Q_{56}$ in FIG. 6A. Until the high level signal supplied from the input terminal 52 is passed through the delay circuit 54, the AND gate circuit 58 is also maintained in a state producing a logic "0" signal at the output terminal $Q_{58}$ thereof as will be seen from the waveform $Q_{58}$ in FIG. 6A. The second NOR gate circuit 60 is thus caused to produce a logic "1" signal at the output terminal OUT of the pulse generator circuit 50 after the signal at the output terminal $Q_{56}$ shifted to low level. The signal at the output terminal $Q_{54}$ of the delay circuit 54 shifts to the high level upon the lapse of a certain delay time after the high level signal appeared at the input terminal 52 of the pulse generator circuit 50, as will be seen from the waveform $Q_{54}$ in FIG. 6A. Upon the rise of the signal at the output terminal $Q_{54}$ of the delay circuit 54, the AND gate circuit 58 now produces a signal at the high level at the output terminal $Q_{58}$ thereof and causes the the second NOR gate circuit 60 to produce a logic "0" signal at the output terminal OUT of the pulse generator circuit 50. Thus, a logic "1" pulse having a time duration represented by T appears at the output terminal OUT of the pulse generator circuit 50. This pulsewidth T of the pulse produced by the pulse generator circuit 50 is approximately equal to the delay time achieved by the capacitor 62 of the sole delay circuit 54.

On the other hand, there remains a high level signal at the output terminal $Q_{54}$ of the delay circuit 54 for a certain period of time after the signal at the input terminal 52 of the pulse generator circuit 50 is shifted from high level to low level. With the signal of high level being present at the output terminal $Q_{54}$ of the delay circuit 54, the first NOR gate circuit 56 is maintained in a state producing a logic "0" signal at the output terminal $Q_{56}$ thereof, as will be seen from the waveforms $Q_{54}$ and $Q_{56}$ in FIG. 6B. In the presence of the logic "0" signals at the output terminal $Q_{56}$ of the first NOR gate circuit 56 and the output terminal $Q_{58}$ of the AND gate circuit 58, the second NOR gate circuit 60 is caused to produce a logic "1" signal at the output terminal OUT of the pulse generator circuit 50. The signal at the output terminal $Q_{54}$ of the delay circuit 54 shifts to low level upon the lapse of a certain delay time after the low level signal appeared at the input terminal 52 of the pulse generator circuit 50, as will be seen from the waveform $Q_{54}$ in FIG. 6B. Upon the fall of the signal to low level at the output terminal $Q_{54}$, the first NOR gate circuit 56 produces a signal of high level at the output terminal $Q_{56}$ thereof and causes the second NOR gate circuit 60 to produce a logic "0" signal at the output terminal OUT of the pulse generator circuit 50. Thus, a logic "1" pulse having the time duration T appears at the output terminal OUT of the pulse generator circuit 50.

Figure 1:
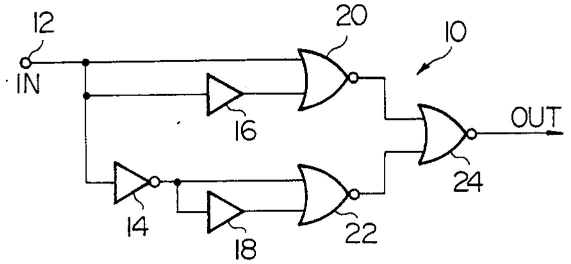
FIG. 1 is a schematic diagram showing a representative example of a known pulse generator circuit of the nature of which the present invention generally appertains.
Figure 2:
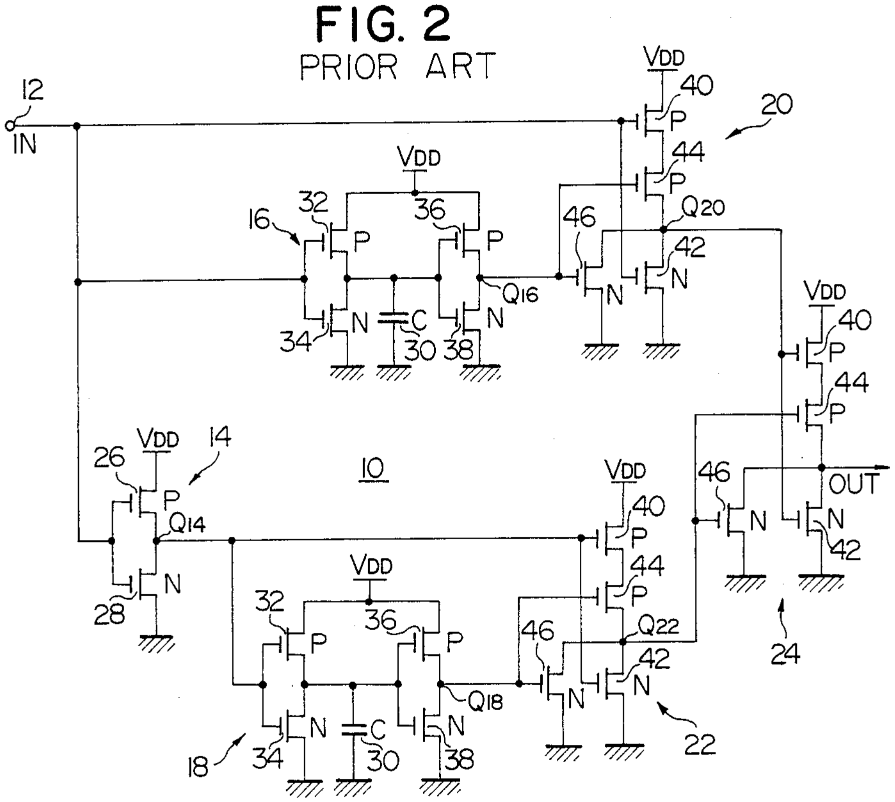
FIG. 2 is a circuit diagram showing a C-MOS implementation of the circuit illustrated in FIG. 1.
Figure 3A:
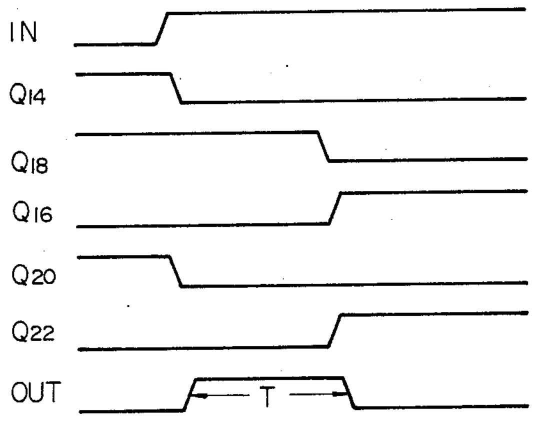
FIGS. 3A and 3B are timing charts which show waveforms of various signals appearing in the pulse generator circuit shown in FIGS. 1 and 2.
Figure 3B:
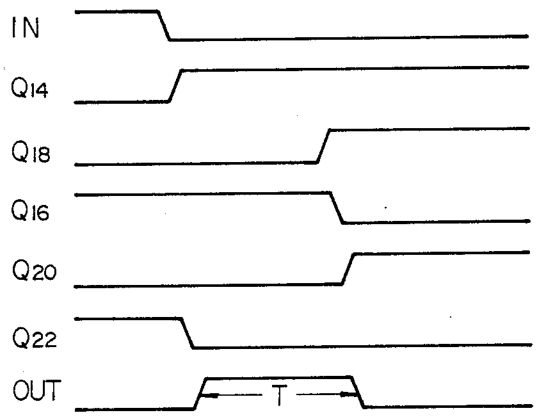

The pulse generator circuit 50 embodying the present invention consists of a sole delay circuit 54, sole AND gate circuit 58 and only two NOR gate circuits 56 and 60 or, more specifically, of only eighteen transistors 64 and 98 and only one capacitor 62. A total of only nineteen circuit components 62 to 98 is thus necessitated for constructing the pulse generator circuit 50, yielding a decrease of five circuit components as compared with the prior-art pulse generator circuit described with reference to FIGS. 1 and 2. If such a pulse generator circuit is used for a memory device having the storage capacity of 64 kilowords, only a total of 304 circuit components ($=19\times16$) suffices for the memory device, yielding a decrease of 80 circuit components as compared with the described prior-art pulse generator circuit. Where these pulse generators are to be implemented as on-chip circuits in the memory device, they thus occupy a significantly reduced space on the chip and thus make it easier to realize a mass memory with a desired storage capacity. There being only one capacitor 62 incorporated in the pulse generator circuit 50, the pulse generator circuit 50 can be easily adjusted to provide a pulsewidth correctly fixed for the rise and fall of the input signal.

Second Preferred Embodiment

Figure 7:
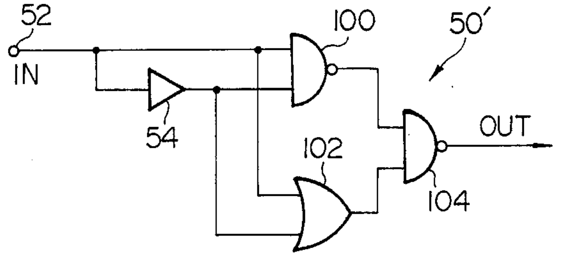
FIG. 7 is a schematic diagram showing a second preferred embodiment of a pulse generator circuit according to the present invention.

Referring to FIG. 7 of the drawings, a second preferred embodiment of a pulse generator circuit according to the present invention, now generally represented by 50', has an input terminal 52 and includes a delay circuit 54, a first two-input NAND gate circuit 100, an OR gate circuit 102 and a second two-input NAND gate circuit 104. The delay circuit 54 has an input terminal connected to the input terminal 52 of the pulse generator circuit 50' and an output terminal connected to one input terminal of the first NAND gate circuit 100 and one input terminal of the OR gate circuit 102, the other input terminal of each of the NAND gate circuit 100 and OR gate circuit 102 being connected directly to the input terminal 52 of the circuit 50'. The NAND gate circuit 100 and OR gate circuit 102 have their respective output terminals connected to the input terminals of the second NAND gate circuit 104. As will be seen as the description proceeds, the second embodiment of the present invention is adapted to produce pulses of logic "0" value in contrast to the first embodiment which is adapted to produce pulses of logic "1" value.

Figure 8:
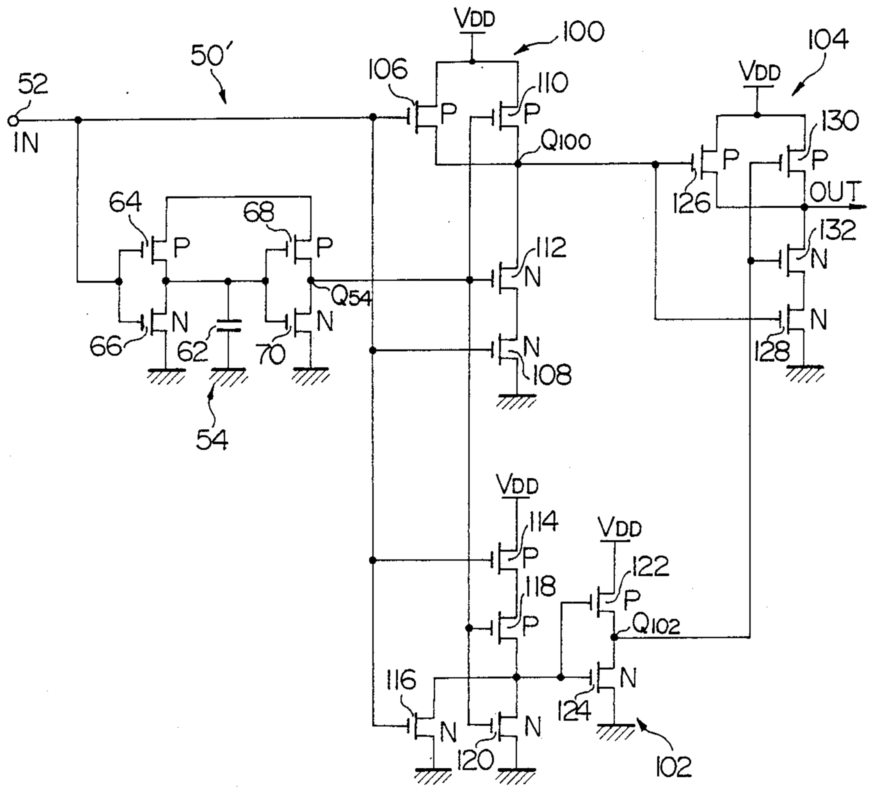
FIG. 8 is a circuit diagram showing a C-MOS implementation of the circuit illustrated in FIG. 7.

FIG. 8 of the drawings depicts a C-MOS implementation of the prior-art pulse generator circuit 50' thus constructed. The delay circuit 54 is constructed similarly to its counterpart in the arrangement shown in FIG. 5 and is thus composed of two C-MOS inverters having a capacitor 62 provided therebetween. One of these C-MOS inverters comprises p-channel and n-channel transistors 64 and 66 and the other C-MOS inverter comprises p-channel and n-channel transistors 68 and 70. The common drain electrode of the transistors 68 and 70 forming the second stage inverter of the delay circuit 54 forms an output terminal $Q_{54}$ of the delay circuit 54.

On the other hand, the first NAND gate circuit 100 comprises a combination of p-channel and n-channel transistors 106 and 108 having a common gate electrode and a combination of p-channel and n-channel transistors 110 and 112 having a common gate electrode and a common drain electrode. The common gate electrode of the transistors 106 and 108 is connected to the input terminal 52 of the pulse generator circuit 50', while the common gate electrode of the transistors 110 and 112 is connected to the output terminal $Q_{54}$ of the delay circuit 54, viz., to the common drain electrode of the p-channel and n-channel transistors 68 and 70 of the delay circuit 54. Each of the p-channel transistors 106 and 110 has its source connected to a supply voltage $V_{DD}$ and its drain connected to the drain of the p-channel transistor 112, the p-channel transistor 106 having its drain connected to the common drain electrode of the transistors 110 and 112. The n-channel transistor 108 has its drain connected to the source of the n-channel transistor 112 and its source connected to the ground line. The node between the drains of the transistors 106, 110 and 112 forms an output terminal $Q_{100}$ of the first NAND gate circuit 100.

Furthermore, the OR gate circuit 102 comprises a combination of p-channel and n-channel transistors 114 and 116 having a common gate electrode, a combination of p-channel and n-channel transistors 118 and 120 having a common gate electrode and a common drain electrode, and a combination of p-channel and n-channel transistors 122 and 124 also having a common gate electrode and a common drain electrode. The common gate electrode of the transistors 114 and 116 is connected to the input terminal 52 of the pulse generator circuit 50', while the common gate electrode of the transistors 118 and 120 is connected to the output terminal $Q_{54}$ of the delay circuit 54, viz., to the common drain electrode of the p-channel and n-channel transistors 68 and 70 of the delay circuit 54. The p-channel transistor 114 has its source connected to the supply voltage $V_{DD}$ and its drain connected to the source of the p-channel transistor 118, the p-channel transistor 122 also having its source connected to the supply voltage $V_{DD}$. The n-channel transistor 116 has its drain connected to the common drain electrode of the p-channel and n-channel transistors 118 and 120 and its source connected to the ground line. The n-channel transistor 120 has its source connected to ground. The common gate electrode of the transistors 122 and 124 is connected to the node between the drains of the transistors 116, 118 and 120, the source of the n-channel transistor 124 being also connected to the ground line. The common drain electrode of the p-channel and n-channel transistors 122 and 124 forms an output terminal $Q_{102}$ of the OR gate circuit 102.

The second NAND gate circuit 104 is similar in construction to the first NAND gate circuit 100 and thus comprises a combination of p-channel and n-channel transistors 126 and 128 having a common gate electrode and a combination of p-channel and n-channel transistors 130 and 132 having a common gate electrode and a common drain electrode. The common gate electrode of the transistors 126 and 128 is connected to the output terminal $Q_{100}$ of the first NAND gate circuit 100, viz., to the node between the drains of the transistors 106, 110 and 112 of the NAND gate circuit 100, while the common gate electrode of the transistors 130 and 132 is connected to the output terminal $Q_{102}$ of the OR gate circuit 102, viz., to the common drain electrode of the p-channel and n-channel transistors 122 and 124 of the OR gate circuit 102. The p-channel transistor 126 has its source connected to the supply voltage $V_{DD}$ and its drain connected to the common drain electrode of the p-channel and n-channel transistors 130 and 132, the p-channel transistor 130 also having its source connected to the supply voltage $V_{DD}$. The n-channel transistor 128 has its drain connected to the source of the n-channel transistor 132 and its source connected to the ground line. The node between the drains of the transistors 126, 130 and 132 forms an output terminal OUT of the pulse generator circuit 50'.

FIGS. 6A and 6B of the drawings show waveforms of the various signals appearing in the pulse generator circuit 50' thus constructed and arranged. In each of FIGS. 6A and 6B, these waveforms include a waveform "IN" which appears at the input terminal 52 of the pulse generator circuit 50', waveforms which appear at the output terminals $Q_{54}$, $Q_{100}$ and $Q_{102}$ of the delay circuit 54, first NAND gate circuit 100 and OR gate circuit 102, respectively, and a waveform "OUT" which appears at the output terminal of the pulse generator circuit 50'.

Figure 9A:
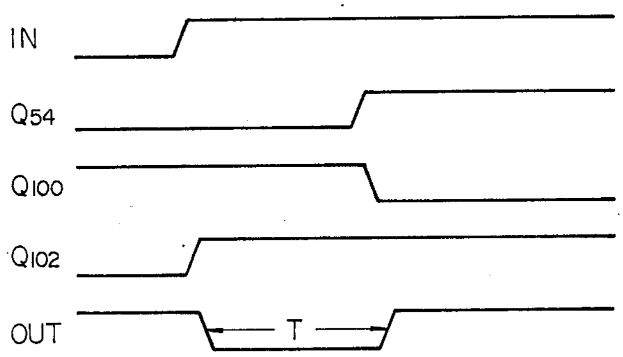
FIGS. 9A and 9B are timing charts which show waveforms of various signals appearing in the pulse generator circuit shown in FIGS. 7 and 8.

In operation, there remains a signal of low level at the output terminal $Q_{54}$ of the delay circuit 54 for a certain period of time after the signal at the input terminal 52 of the pulse generator circuit 50' is shifted from low level to high level. With the signal of high level present at the input terminal 52, the first NAND gate circuit 100 is maintained in a state producing a logic "1" signal at the output terminal $Q_{100}$ thereof as will be seen from the waveform $Q_{100}$ in FIG. 9A. The signal of high level at the input terminal 52 also produces a logic "0" signal at the output terminal $Q_{102}$ of the OR gate circuit 102 so that the second NAND gate circuit 104 produces a logic "0" signal at the output terminal OUT in the presence of the logic "1" signals at both of its input terminals as will be seen from the waveforms $Q_{100}$, $Q_{102}$ and OUT in FIG. 9A. The signal at the output terminal $Q_{54}$ of the delay circuit 54 shifts to the high level upon the lapse of a certain delay time after the signal of high level appeared at the input terminal 52 of the pulse generator circuit 50', as will be seen from the waveform $Q_{54}$ in FIG. 9A. Upon the rise of the signal at the output terminal $Q_{54}$ of the delay circuit 54, the first NAND gate circuit 100 now produces a logic "0" signal at the output terminal $Q_{100}$ thereof so that the second NAND gate circuit 104 produces a logic "1" signal at the output terminal OUT of the pulse generator circuit 50'. Thus, a logic "0" pulse having a time duration T approximately equal to the delay time achieved by the capacitor 62 of the sole delay circuit 54 appears at the output terminal OUT of the pulse generator circuit 50'.

Figure 9B:
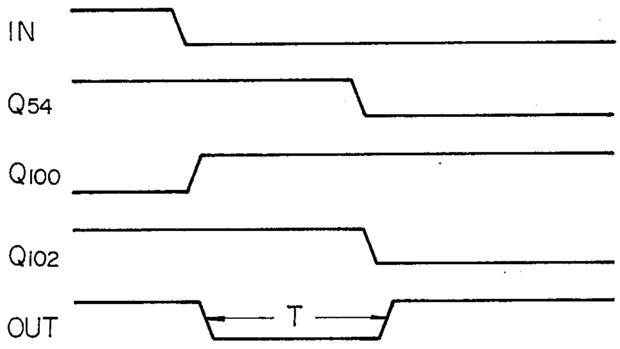

When the signal at the input terminal 52 of the pulse generator circuit 50' is then shifted from high level to low level, the first NAND gate circuit 100 produces a logic "1" signal at the output terminal $Q_{100}$ thereof as will be seen from the waveform $Q_{100}$ in FIG. 9B. For a certain period of time after the signal at the input terminal 52 of the pulse generator circuit 50' is shifted to low level, the signal of high level remains at the output terminal $Q_{54}$ of the delay circuit 54. The OR gate circuit 102 is thus maintained in the state producing the logic "1" signal at the output terminal $Q_{102}$ thereof as will be seen from the waveform $Q_{102}$ in FIG. 9B. In the presence of the logic "1" signals at the output terminal $Q_{100}$ of the first NAND gate circuit 100 and the output terminal $Q_{100}$ of the OR gate circuit 102, the second NAND gate circuit 104 produces a logic "0" signal at the output terminal OUT of the pulse generator circuit 50'. The signal at the output terminal $Q_{54}$ of the delay circuit 54 shifts to low level upon the lapse of a certain delay time after the signal of low level appeared at the input terminal 52 of the pulse generator circuit 50', as will be seen from the waveform $Q_{54}$ in FIG. 6B. Upon the fall of the signal at the output terminal $Q_{54}$ of the delay circuit 54, the OR gate circuit 102 produces a signal of low level at the output terminal $Q_{100}$ thereof and causes the the second NAND gate circuit 104 to produce a logic "1" signal at the output terminal OUT of the pulse generator circuit 50'. Thus, a logic "0" pulse having the time duration T appears at the output terminal OUT of the pulse generator circuit 50'.

The pulse generator circuit 50' embodying the present invention consists of a sole delay circuit 54, a single OR gate circuit 102 and only two NAND gate circuits 100 and 104 or, more specifically, of only eighteen transistors and one capacitor as in the embodiment shown in FIGS. 4 and 5. A total of only nineteen circuit components 62 is thus necessitated for constructing the pulse generator circuit 50'; providing advantages comparable to those achieved by the embodiment of FIGS. 4 and 5.

What is claimed is:

1. A pulse generator circuit, comprising;

(a) a non-inverting delay circuit asynchronously responsive to an input signal for producing a first output signal after a predetermined delay time, (b) a first logic circuit responsive to said input signal and said first output signal for producing a second output signal having a first logic state when both said input signal and said first output signal concurrently have a second logic state, (c) a second logic circuit responsive to said input signal and said first output signal for producing a third output signal having said first logic state when both said input signal and said first output signal have said first logic state, and (d) a third logic circuit responsive to said second and third output signals for producing a circuit output signal having said first logic state when both said second and third output signals concurrently have said second logic state, said circuit output signal forming a pulse signal having a pulsewidth substantially equal to said predetermined delay time, said third logic circuit being operative to produce said circuit output signal in response to transitions of said input signal from said first state to said second state and from said second state to said first state.

2. A pulse generator circuit as set forth in claim 1, in which each of said first and third logic circuits comprises a logic NOR gate circuit and wherein said second logic circuit comprises a logic AND gate circuit.

3. A pulse generator circuit as set forth in claim 1, in which each of said first and third logic circuits comprises a logic NAND gate circuit and wherein said second logic circuit comprises a logic OR gate circuit.

4. A pulse generator circuit, comprising;

(a) a non-inverting delay circuit asynchronously responsive to an input signal for producing a first output signal after a predetermined delay time, (b) a first logic NOR gate circuit having a first input terminal receiving said input signal and a second input terminal receiving said first output signal, for producing a second output signal having a first logic level when both said input signal and said first output signal concurrently have a second logic level, (c) a logic AND gate circuit having a first input terminal receiving said input signal and a second input terminal receiving said first output signal, for producing a third output signal having said first logic level when both said input signal and said first output signal have said first logic level, and (d) a second logic NOR gate circuit having a first input terminal receiving said second output signal and a second input terminal receiving said third output signal, for producing an output pulse signal having said first logic level when both said second and third output signals concurrently have said second logic level, said output pulse signal being substantially equal in pulsewidth to said predetermined delay time, said second logic NOR gate circuit being operative to produce said output pulse signal in response to transitions of said input signal from said first level to said second level and from said second level to said first level.

5. A pulse generator circuit, comprising;

(a) a non-inverting delay circuit responsive to an input signal for producing a first output signal after a predetermined delay time, (b) a first logic NAND gate circuit having a first input terminal receiving said input signal and a second input terminal receiving said first output signal, for producing a second output signal having a first logic level when both said input signal and said first output signal concurrently have a second logic level, (c) a logic OR gate circuit having a first input terminal receiving said input signal and a second input terminal receiving said first output signal, for producing a third output signal having said first logic level when both said input signal and said first output signal have said first logic level, and (d) a second logic NAND gate circuit having a first input terminal receiving said second output signal and a second input terminal receiving said third output signal, for producing an output pulse signal having said first logic level when both said second and third output signals concurrently have said second logic level, said output pulse signal being substantially equal in pulsewidth to said predetermined delay time, said second logic NAND gate circuit being operative to produce said output pulse signal in response to transitions of said input signal from said first level to said second level and from said second level to said first level.

6. A pulse generator circuit as set forth in claim 1, wherein said delay circuit comprises a first series combination of p-channel and n-channel field-effect transistors having an input node responsive to said input signal, and an output node; a second series combination of p-channel and n-channel field-effect transistors having an input node connected to the output node of said first series combination of p-channel and n-channel field-effect transistors, and an output node connected to one input terminal of said first logic circuit and to one input terminal of said second logic circuit; and a capacitor having an electrode connected between the output node of said first series combination of p-channel and n-channel field-effect transistors and the input node of said second series combination of p-channel and n-channel field-effect transistors.

7. A pulse generator circuit as set forth in claim 4, wherein said delay circuit comprises a first series combination of p-channel and n-channel field-effect transistors having an input node responsive to said input signal, and an output node; a second series combination of p-channel and n-channel field-effect transistors having an input node connected to the output node of said first series combination of p-channel and n-channel field-effect transistors, and an output node connected to said second input terminal of said logic NOR gate circuit and to said second input terminal of said logic AND gate circuit; and a capacitor having an electrode connected between the output node of said first series combination of p-channel and n-channel field-effect transistors and the input node of said second series combination of p-channel and n-channel field-effect transistors.

8. A pulse generator circuit as set forth in claim 5, wherein said delay circuit comprises a first series combination of p-channel and n-channel field-effect transistors having an input node responsive to said input signal, and an output node; a second series combination of p-channel and n-channel field-effect transistors having an input node connected to the output node of said first series combination of p-channel and n-channel field-effect transistors, and an output node connected to said second input terminal of said logic NAND gate circuit and to said second input terminal of said logic OR gate circuit; and a capacitor having an electrode connected between the output node of said first series combination of p-channel and n-channel field-effect transistors and the input node of said second series combination of p-channel and n-channel field-effect transistors.

* * * * *